United States Patent
Chuang et al.

(10) Patent No.: US 6,795,746 B2
(45) Date of Patent: Sep. 21, 2004

(54) SYSTEM FOR PROVIDING IC BONDING DIAGRAM VIA NETWORK

(75) Inventors: Chun-Min Chuang, Pingtung (TW);
I-Liang Lin, Tainan (TW);
Chun-Kuang Lin, Kaohsiung (TW);
Yung-I Yeh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 291 days.

(21) Appl. No.: 09/815,998

(22) Filed: Mar. 22, 2001

(65) Prior Publication Data

US 2002/0188371 A1 Dec. 12, 2002

(51) Int. Cl.⁷ .............................................. G06F 19/00
(52) U.S. Cl. .............................. 700/121; 716/4; 716/5; 716/15; 228/4.5; 228/179.1
(58) Field of Search ............................. 700/121; 716/15, 716/4, 5; 228/4.5, 179.1

(56) References Cited

U.S. PATENT DOCUMENTS 5,281,849 A * 1/1994 Singh Deo et al. ......... 257/666
6,256,549 B1 * 7/2001 Romero et al. ............. 700/121
6,357,036 B1 * 3/2002 Eka et al. .................... 716/15

* cited by examiner

*Primary Examiner*—Leo Picard
*Assistant Examiner*—Charles Kasenge
(74) *Attorney, Agent, or Firm*—Blakely Sokoloff Taylor & Zafman

(57) ABSTRACT

The internet bonding diagram system comprises a processing unit to process the information send by a user via a network. A blank lead frame/substrate database is coupled to the processing unit to store lead frame information. A job database is coupled to the processing unit to store information forwarded by a potential client, wherein the job database includes buyer satisfaction data provided by said user. A bonding diagram generator is coupled to the processing unit to generate a layout of bonding diagram in accordance with the information provided by the user. A forwarding module is responsive to the bonding diagram generator to forward the layout of bonding diagram to the user.

11 Claims, 6 Drawing Sheets

| Job Data Table | | |
|---|---|---|
| Field Name | Field Type | Field Description |
| No | numerical | the number of entrusted job from iBDS |
| Done | character | the record whether the job had been finished |
| User | character | the user of the job |
| Date | time | the data and time of the job |
| Type | character | the package type of the job |
| Index | character | the package code of the job |
| Size | character | the size of package body |
| L C | numerical | the lead count of the package of the job |
| D Size | character | the die size, length and width of the package |
| BD Size | character | the each pad size of length and width of the package |
| P Size | numerical | the distance between pad and pad |
| Material | character | the material of lead frame |
| Die Dir | character | the normal direction of die |
| Ground | character | whether the die is die down (ground connection) |
| Layers | character | the number of bond pad layer |
| Net list | file | the file of net list file uploading from user of the job |
| Bonding File | file | the final bonding diagram of the job |
| Check | character | whether the job is successful |
| Memo | character | the remark or memo of the job |

FIG.2

| The Data of Blank Lead Frame Diagram Table | | |
|---|---|---|
| Field Name | Field Type | Field Description |
| No | numerical | the number of blank lead frame in sequence |
| Part No | character | the serial of blank lead frame |
| Part Date | Date | the date of built the lead frame |
| Type | character | the package type of the blank lead frame |
| Index | character | the package code of the blank lead frame |
| Size | character | the package Size of the blank lead frame |
| Lead Count | numerical | the lead count of the blank lead frame |
| LF Size | character | the lead frame size |
| Material | character | the material of lead frame |
| Die Dir | character | the normal direction of die |
| RP | character | whether the die is die down (ground connection) |
| Safe Q | numerical | the safe quantity of lead frame on stockroom |
| Reserve Q | numerical | the supplied quantity of lead frame on stockroom |
| Order Q | numerical | the order quantity of lead frame on stockroom |
| Price | character | the price of lead frame sort |
| Memo | character | the remark or memo |

SYSTEM FOR PROVIDING IC BONDING DIAGRAM VIA NETWORK

FIELD OF THE INVENTION

The present invention relates to a system for automatically providing preliminary bonding diagram of IC package layout to the customer via a communication network, and more specifically, to a system for the customer to goal a bonding result layout of package type.

BACKGROUND OF THE INVENTION

Modern network systems must allow computers to electronically communicate with each other in order to ensure shared transmission and manipulation of information. Conventional commerce involves a salesman using a telephone and a facsimile machine to negotiate a sale with a customer. In this method, two parties negotiate transaction items such as the quantity of goods for purchase, specifications of the merchandise, and payment terms. In addition to spending a significant amount of time, the conventional method of commerce is slow, time-intensive and expensive to initiate and maintain.

Rapid development of the Internet has enabled computer systems to provide an efficient, widely accessible, and secure mechanism for conducting electronic commerce. By connecting most computer systems worldwide, the network allows users to interact using various services such as electronic mail and the World Wide Web (WWW). E-mail allows individuals to communicate with each other by linking a computer system with the Internet. Designed as an easy visual interface for users, the WWW allows a server computer, called a web site, to send graphical web pages of information (web pages) to a client computer and display the web pages. These Web pages may contain control regions, such as simulated push buttons, that allow the user to acquire and display additional related web pages of information in a hypertext fashion. Each client and server has an Internet address called a Uniform Resource Locator ("URL"). The WWW uses the HTTP protocol. Currently, a Hyper Text Markup Language ("HTML") file defines a web page. A browser refers to the software on a client computer that manages the Internet connections and interprets as well as executes the commands in HTML documents. In general, web servers are stateless with respect to client transactions.

Some systems have been invented in the past to provide the service via internet including the system for matching the sellers and the buyers, the good shopping and so on. One of the prior arts may be seen in the U.S. Pat. No. 6,098,051 to Lupien, et al., filed on Oct. 21, 1997, entitled "Crossing network utilizing satisfaction density profile". The system matches buy and sell orders based upon a satisfaction and quantity profile.

However, there is no system to provide the service of providing preliminary bonding diagram of IC package layout to the customer via a communication network. It spends more than one week in accordance with the method of conventional bonding diagram (BD) design. The customer has no way to know the bonding result layout of 2D package. Thus, there is a need to shorten the time of BD design and have a system for the customer himself to obtain the fitted bonding diagram before the packaging products to be mass production.

SUMMARY OF THE INVENTION

Base on the previous discussion, the object of the present invention is to provide a system for a customer to obtain the preliminary bonding diagram of IC package layout via a communication network.

The internet bonding diagram system comprises a processing unit to process the information sent by a user via a network. A blank lead frame/substrate database is coupled to the processing unit to store lead frame information. A job database is coupled to the processing unit to store information forwarded by a potential client, wherein the job database includes buyer satisfaction data provided by said user. A bonding diagram generator is coupled to the processing unit to generate a layout of bonding diagram in accordance with the information provided by the user. A forwarding module is responsive to the bonding diagram generator to forward the layout of bonding diagram to the user.

A method for automatically providing bounding diagram of a semiconductor package comprises inputting a user satisfaction relating to a semiconductor package by a user. Then, the system records the user satisfaction and retrieves a blank frame diagrams from a blank lead frame database that matches the user satisfaction selected by the user. A bonding diagram generator generates a bonding diagram that meets the user satisfaction; and forwards the bonding diagram to the user through a network.

BRIEF DESCRIPTION OF THE DRAWINGS

FIG. 2 is a structure of the job database according to the present invention.

FIG. 3 is a structure of the blank lead frame/substrate database according to the present invention.

FIG. 5 is the user end interface according to the present invention.

DETAILED DESCRIPTION

The present invention discloses a system that provides the IC package layout diagram to the user when a plurality of parameters have been input by the user via an internet. Therefore, the user may goal the result bonding diagram of package before the mass production via a communication network and the user may alter the design by himself via re-input parameters through network. The internet bonding diagram system (iBDS) serves as a central control system to send information to the client, the system receives the information from the client and process the request, then informs the result to the client end. The present invention can be implemented using a computer with a display screen and a positional input device. The iBDS integrates the web browser data collection system, database of blank lead frame/substrate diagram, automation bonding wire routing engine and delivery system.

Figure 1:
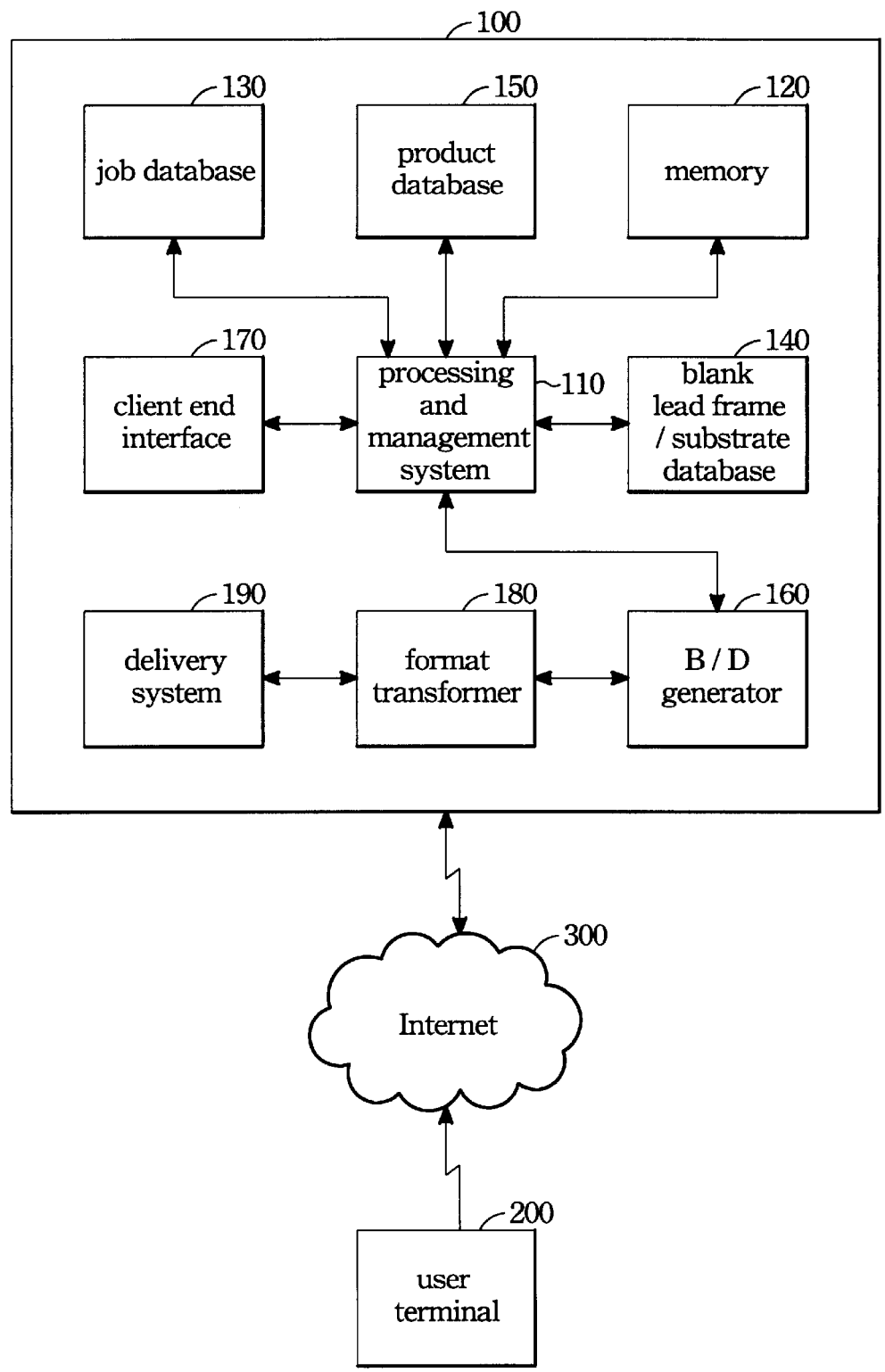
FIG. 1 is a functional diagram of the internet bonding diagram system according to the present invention.

With reference to the FIG. 1, there is illustrated a block diagram of the architecture of the internet bonding diagram system (iBDS) 100 according to the present invention. A processing and management system (PMS) 110 process the request transmitted to the system from the terminal 200 of the customer. A storage device such as memory 120 is coupled to the processing and management system (PMS) 110 to store application software and the like. A bonding diagram database (or the blank lead frame/substrate database) 140 is coupled the PMS 110 for storing blank lead frame/substrate diagram. The product database 150 is also coupled to the PMS 110 to store the product information. A bonding diagram generator 160 is coupled to the PMS 110 to generate the package layout of the bonding diagram in accordance with the parameter sent by the terminal 200 of the customer. The iBDS (Internet Bonding Diagram System) 100 is powerful for customer who needs to estimate preliminary bonding diagram of an interested IC package layout of QFP family on the internet automatically. With uploading, for example, bonding Excel file and a few key-in data, customer can get a layout drawing of 2D package type you interested bonding result which including QFP, TQFP, LQFP, PDIP, SOP, SOJ, SSOP, TSOP TQFP. Further, the present invention may be used for BGA family package that includes but not limited to typical BGA, VIPER BGA, EBGA, EPBGA, UFP BGA, TF BGA and so on. Namely, the user may interact with the PMS 110 through the client end interface 170 that is coupled to the PMS 110. The internet bonding diagram system (iBDS) 100 may includes a format transformer 180 which is connected to the bonding diagram generator 160 for transforming the format of the file or the bonding diagram to allow the user to read the ordered bonding diagram. To phrase in another words, the format transformer 180 is used to transform the graph file to a desired format for the user. Further, a delivery system 190 is coupled to the format transformer 180.

The client desiring to transact has to access a terminal 200 including processing unit such as CPU. The terminal 200 of the client may be a computer, PDA, WAP mobile phone or the like. The terminal 200 is coupled to the PMS 110 over the internet 300 via the communication module. Each client terminal includes one or more input/output modules that allow for the entry of the system and the display of output. As known in the art, the client terminal also includes a storage device such as memory coupled to the processing unit.

The system 100 also includes job database 130 coupled to the PMS 110, the item stored in the job database 130 is list in the following table, which is used for example rather than limiting the scope of the present invention. Turning now to FIG. 2, there is illustrated an example item stored in the job database 130. It includes, for example, the number of the entrusted job from IBDS, the user code, date, package type, package code, lead count, die size, bonding pad size. It further contains pitch between bonding pads, the number of bond pad layer. Other items may refer to the FIG. 2. Please turning to FIG. 3, it shows the example of the item stored in the blank lead frame/substrate database 140. A part of the items may be seen in the table, the major part of the blank lead frame/substrate database 140 includes the package type of the blank lead frame, package size of the blank lead frame, lead count of the blank lead frame, lead frame size, the safe quantity of lead frame on stockroom, the price of lead frame sort. Other parameter may refer to the FIG. 3. Further, the lead frame material may also be contained in the database 140. For example, the package type decision box allows the user to chose the type of IC package, and the package size decision box allows the user to set the dimension of the IC package. Similarly, the user may define the lead count, die size, bond pad size, bond pad pitch and so on by corresponding means. Further, the interface also permits the user to decide the lead frame material, the number of the bond pad layer and the die direction. Those functions may refer to FIGS. 3 and 5.

Figure 4:
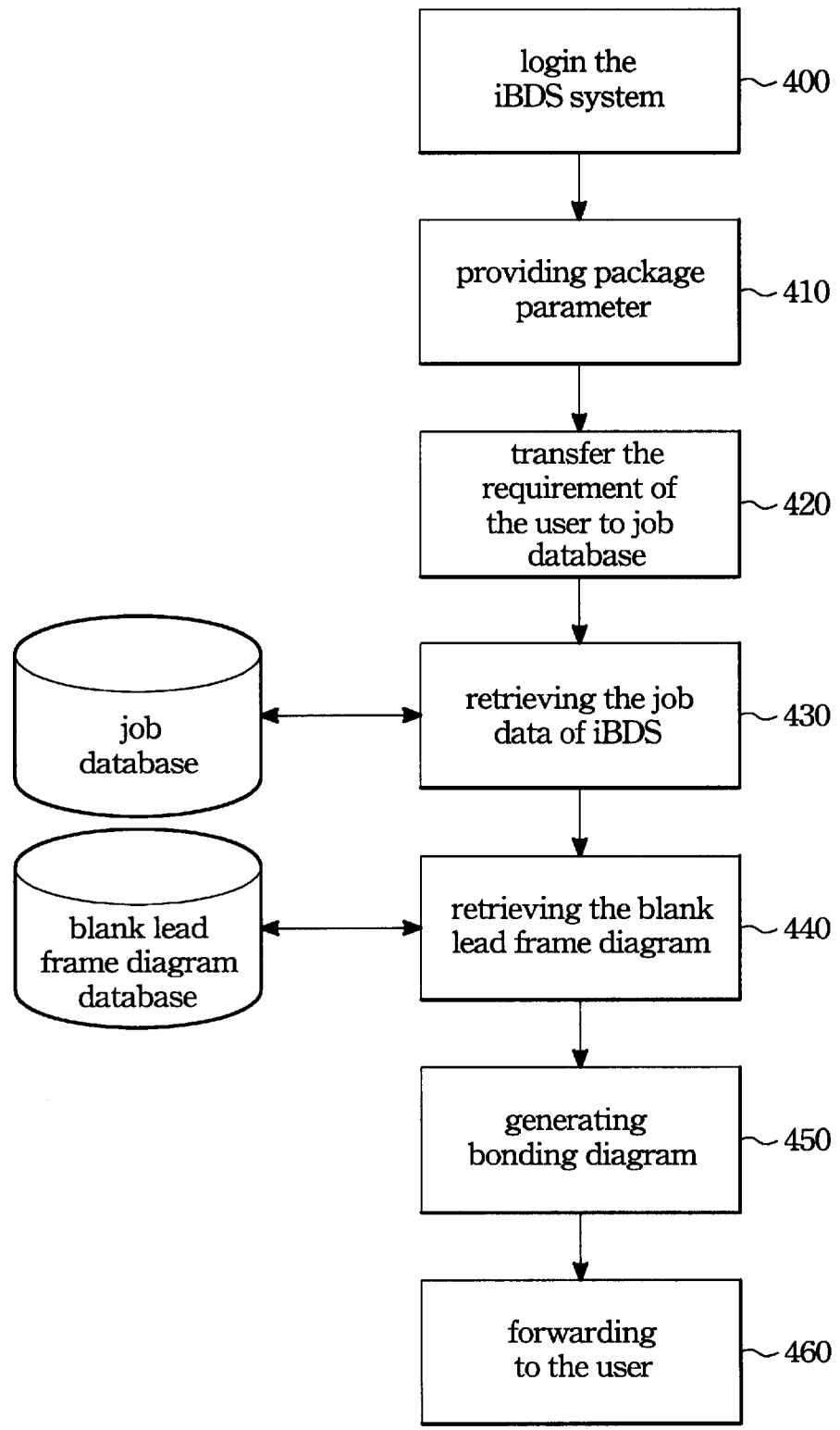
FIG. 4 is a flow chart diagram according to the present invention.

FIG. 4 is a flow chart in accordance with the present invention. The user may login the IBDS of E-package (step 400) and the user may download the standard file format of the net list regulated by IBDS if the client is the first time to access the system. The down load file includes a sample file illustrated the fields have to be filled out and blank net list file to allow the user for creating the layout of die pad on the die and other information. Thus, the user provides some data, and uploads net list file from the iBDS. The user may enter satisfaction data including the package parameters at steps 410. It will be appreciated that any buyer can enter one or more satisfaction information. The internet bonding diagram system (iBDS) 100 will records the information sent from the potential client and stores the buyer satisfaction into the database step 420. The requirement and data of the web user is transmitted to the job database 130 of the iBDS 100 and stored therein.

Next, step 430, the PMS 110 retrieves the information from the job database 130 and processes the information. The PMS 110 includes both auto selected diagram system and auto routing system. Afterward, in step 440 the PMS 110 retrieves the blank frame diagrams matched the conditions selected by the user. Subsequently, after the selected diagram process and auto routing system completed, in step 450, the B/D generator 160 generates a new bonding diagram that meets the requirement of the user. The delivery system 190 next (step 460) forwards the bonding diagram to the user through network.

Figure 7:
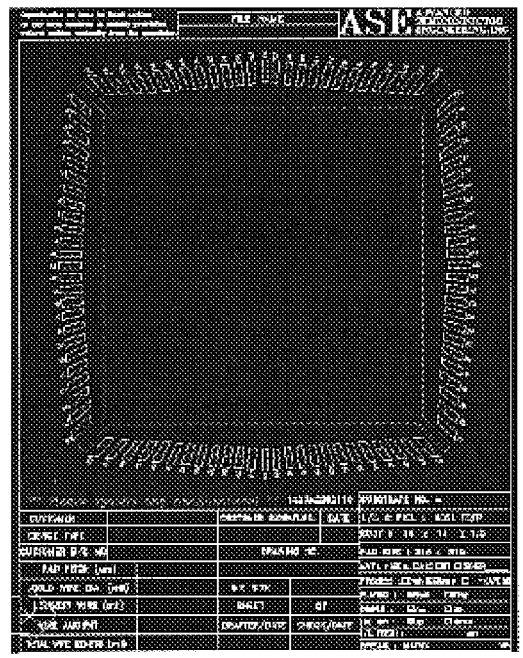
FIG. 7 and FIG. 8 are the output bonding diagram according to the present invention.
Figure 8:
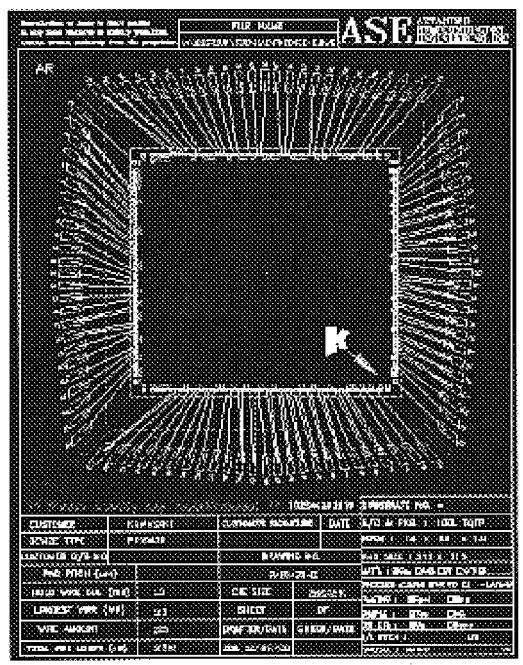

FIG. 7 and FIG. 8 are the outputs of the bonding diagram according to the present invention.

Figure 5:
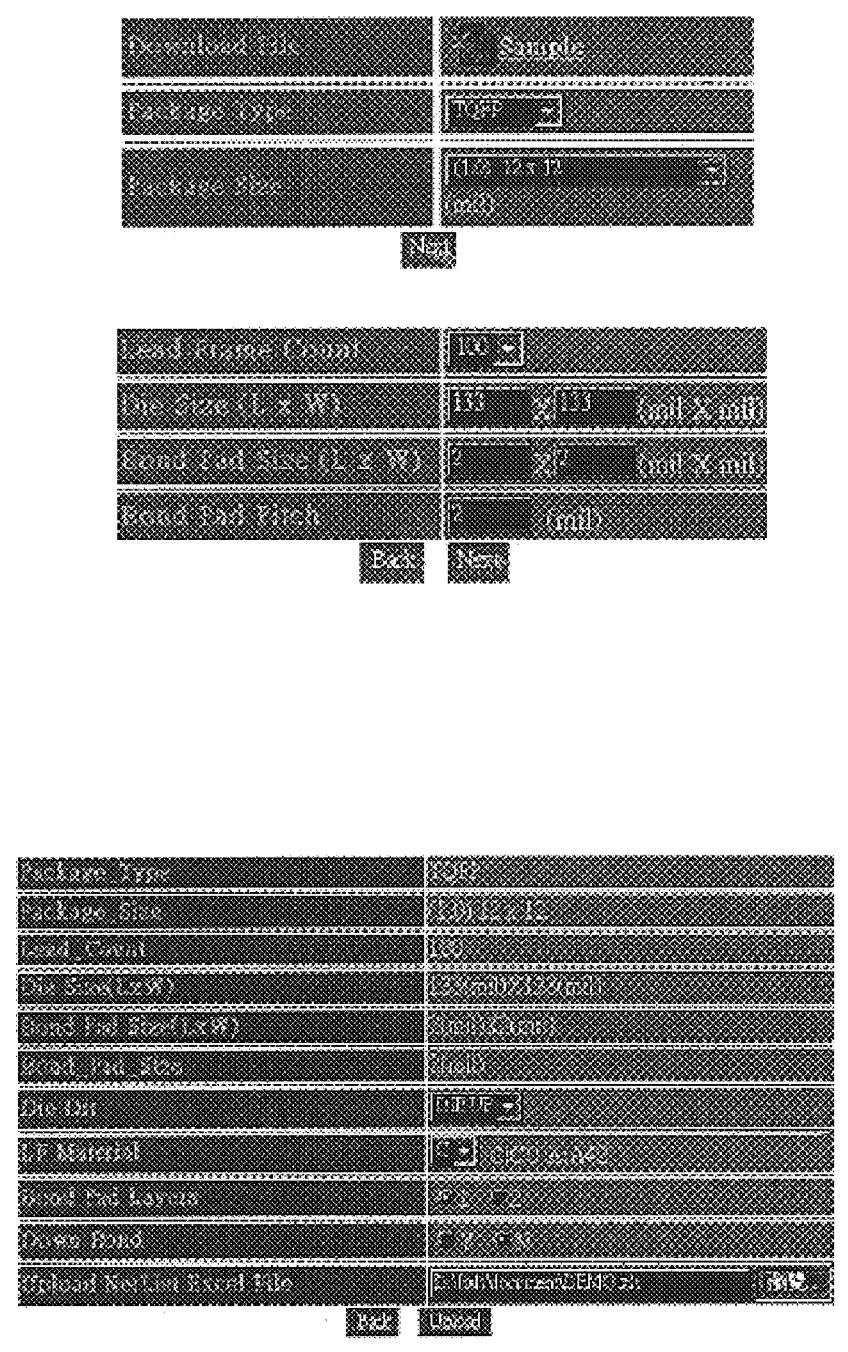

The data or satisfaction is entered at each trader terminal, which is electronically transmitted to the IBDS 100 and stored as files in the job database 130 of the system 100. In the representative embodiment, the user end interface is shown in FIG. 5 as an example rather than limiting to the present invention. It has to be noted that the configuration of the interface is used for sample, not for limiting the present invention. In FIG. 5, the user may down load the example file and select the package type, the package size. Other parameter may refer to the FIG. 5.

Figure 6:
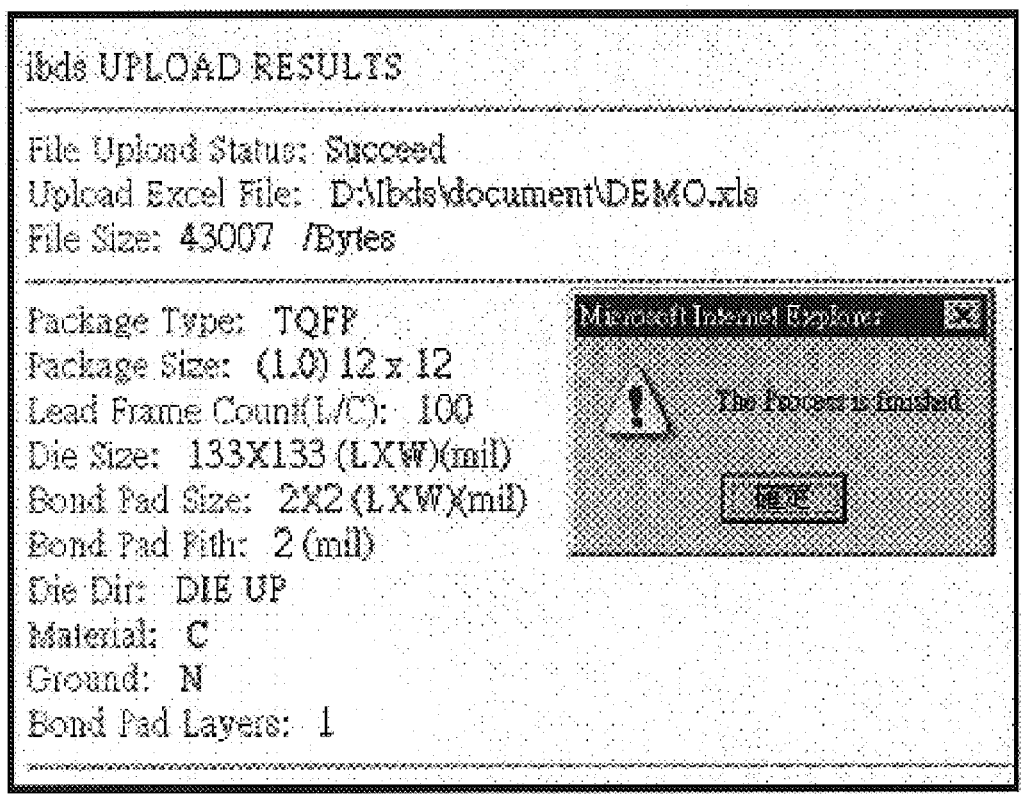
FIG. 6 is the user end interface according to the present invention.

The delivery system 190 will forward to the buyer 200 via common network to acknowledge the satisfaction information. The result interface is shown in FIG. 6 AS AN EXAMPLE. If the buyer confirms the transaction and then forwards to the system iBDS 100, the PMS 110 will active the transaction generator to process the transaction.

The present invention provides a storage medium for automatically providing bounding diagram of a semiconductor package comprises:

means for inputting parameters relating to a semiconductor package by a user;

means for recording the user parameters;

means for retrieving a blank frame diagrams from a blank lead frame/substrate database that matches the user parameters selected by the user; and means for generating a bonding diagram that meets the user parameters of the user by a bonding diagram generator.

Further, the present invention also allows the user to input relating parameters. The storage medium according to the present invention for a user providing parameters of bounding diagram of a semiconductor package comprises:

means for inputting the semiconductor package type;

means for inputting the semiconductor package size; and means for inputting the semiconductor package lead count.

means for inputting a bond pad size of the semiconductor package;

means for inputting a bond pad pitch of the semiconductor package; and means for inputting a number of the bond pad layer of the semiconductor package.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An internet bonding diagram system comprises:

a processing unit to process an information sent by a user via a network, wherein said information comprises a user information and a package information;

a blank lead frame/substrate database coupled to said processing unit to store a lead frame information of said internet bonding diagram system, wherein the blank lead frame/substrate database comprises a package type of a blank lead frame, a package size of said blank lead frame, a number of a lead count of said blank lead frame, a lead frame size, a safe quantity of lead frame on stockroom, a price of lead frame sort, and a lead frame material;

a job database coupled to said processing unit to store said package information sent by said user, wherein the job database comprises buyer satisfaction data provided by said user, a package type, a package code, a number of lead counts, a bonding pad size, a pitch between said bonding pads, and a number of bond pad layer;

a bonding diagram generator coupled to said processing unit to generate a layout of bonding diagram in accordance with said package information sent by said user; and a forwarding module responsive to said bonding diagram generator to forward said layout of bonding diagram to said user.

2. The system of claim 1, further comprising a format transformer is connected to said bonding diagram generator for format transformation.

3. A method for automatically providing bonding diagram of a semiconductor package comprises:

inputting parameters relating to a semiconductor package by a user;

recording said user parameters in a job database;

retrieving a blank frame diagrams from a blank lead frame/substrate database that matches said user parameters selected by said user;

generating a bonding diagram that meets said user parameters of said user by a bonding diagram generator; and forwarding said bonding diagram to said user through a network.

4. The method of claim 3, wherein said job database includes a user code and date.

5. The method of claim 3, wherein said job database includes a package type, a package code, a number of lead counts, a bonding pad size, a pitch between said bonding pads, a number of bond pad layer.

6. The method of claim 3, wherein said blank lead frame/substrate database includes a package type of a blank lead frame, a package size of said blank lead frame, a number of a lead count of said blank lead frame and a lead frame size.

7. The method of claim 3, wherein said blank lead frame/substrate database includes a safe quantity of lead frame on stockroom, a price of lead frame sort.

8. The method of claim 3, wherein said blank lead frame/substrate database includes a lead frame material.

9. A storage medium for automatically providing bounding diagram of a semiconductor package comprises:

means for inputting parameters relating to a semiconductor package by a user;

means for recording said user parameters; means for retrieving a blank frame diagrams from a blank lead frame/substrate database that matches said user parameters selected by said user; and means for generating a bonding diagram that meets said user parameters of said user by a bonding diagram generator.

10. The storage medium of claim 9, wherein said user parameters includes a package type, lead counts, bonding pad size, a pitch between said bonding pads and a number of bond pad layer.

11. The storage medium of claim 9, wherein said blank lead frame database includes a package type of a blank lead frame, a package size of said blank lead frame, a lead count of said blank lead frame, a lead frame size, a safe quantity of lead frame on stockroom, a price of lead frame sort and a lead frame material.

* * * * *